United States Patent
Tseng et al.

(10) Patent No.: US 6,651,284 B2
(45) Date of Patent: Nov. 25, 2003

(54) SCRUBBING ASSEMBLY FOR WAFER-CLEANING DEVICE

(75) Inventors: Kao-Mao Tseng, Hsinchu Hsien (TW); Su-Ling Tseng, Hsinchu Hsien (TW); Hsin Yi Chang, Keelung (TW)

(73) Assignee: Silicon Integrated Systems Corp. (TW)

( * ) Notice: Subject to any disclaimer, the term of this patent is extended or adjusted under 35 U.S.C. 154(b) by 92 days.

(21) Appl. No.: 09/973,706

(22) Filed: Oct. 11, 2001

(65) Prior Publication Data

US 2003/0070242 A1 Apr. 17, 2003

(51) Int. Cl.[7] .............................. B08B 1/04; B08B 3/02; B08B 3/12
(52) U.S. Cl. .................. 15/77; 15/88.2; 134/104.1; 134/184; 134/186; 134/199; 134/902
(58) Field of Search ............. 15/77, 88.2; 134/104.1, 134/184, 186, 199, 902

(56) References Cited

U.S. PATENT DOCUMENTS

| 4,476,601 A | * | 10/1984 | Oka | 15/77 X |
| 5,636,401 A | * | 6/1997 | Yonemizu et al. | 15/77 |
| 5,647,083 A | * | 7/1997 | Sugimoto et al. | 15/77 |
| 5,685,039 A | * | 11/1997 | Hamada et al. | 15/88.2 |
| 6,141,812 A | * | 11/2000 | Matsuda et al. | 15/77 X |
| 6,158,075 A | * | 12/2000 | Tanaka et al. | 15/77 X |
| 6,418,584 B1 | * | 7/2002 | Teeny et al. | 15/77 X |

* cited by examiner

*Primary Examiner*—Mark Spisich
(74) *Attorney, Agent, or Firm*—Birch, Stewart, Kolasch & Birch, LLP

(57) ABSTRACT

A scrubbing assembly for a wafer-cleaning device is provided. The wafer-cleaning device is provided with a base. The scrubbing assembly comprises a scrubber, a cup and an oscillator. The scrubber is disposed on the base in a manner such that it can move between a first position and a second position. The scrubber scrubs a wafer when it locates in the first position. The cup, for receiving DI water, is disposed on the base. The scrubber locates inside the cup and contacts the DI water when it locates in the second position. The oscillator is disposed at the cup, and it vibrates the DI water when the scrubber locates inside the cup and is contact with the DI water.

7 Claims, 3 Drawing Sheets

SCRUBBING ASSEMBLY FOR WAFER-CLEANING DEVICE

BACKGROUND OF THE INVENTION

1. Field of the Invention

The invention relates to a scrubbing assembly for a wafer-cleaning device; in particular, the invention relates to a scrubbing assembly with an extended lifespan and enhanced scrubbing ability.

2. Description of the Related Art

Production of semiconductor devices having microscopic structure requires high-precision technology. During processing, minute particles of dust on the circuits which constitute a semiconductor device may degrade the reliability of the finished semiconductor device. Even if dust contaminants produced during processing, which end up on a semiconductor wafer, do not adversely affect the circuit functions of the semiconductor device, they still may lead to fabrication difficulties. Therefore, the semiconductor device must be fabricated in a dirt-free environment, and the surface of the semiconductor wafer must be washed to remove minute particles of dust generated during processing.

The cleaning steps are carried out by sprinkling pure water on the wafer surface, or by allowing a rotary-fiber brush bearing a cleaning agent or pure water to contact the surface of the wafer. Scrubbing equipment is used to clean the surface of the wafer by removing dust contaminants with a brush and pure water.

Referring to FIG. 1, a conventional wafer-cleaning device 100, using DI water, is shown. Numeral 80 represents a base. Parts of the device 100 can be disposed inside the base 80. A bath 10 is disposed inside the base 80. A vacuum chuck (not shown) and a rotary shaft (not shown), connected to the vacuum chuck, are disposed inside the bath 10. A wafer 20 can be disposed on the vacuum chuck. The wafer 20, disposed on the vacuum chuck, rotates at high speed by the action of the rotary shaft.

A first arm 61 and a second arm 62 are disposed inside the base 80. A scrubber 16 is disposed at the front end of the first arm 61, and can swing along a direction, as shown by arrow E. The scrubber 16 is in contact with the wafer 20 disposed on the vacuum chuck and scrubs the surface of the wafer 20. A step motor 41, 42 and a cylinder 43, as shown in FIG. 2a, electrically connected to the scrubber 16, move and rotate the scrubber 16.

A sprayer 32 is disposed at the front end of the second arm 62. A step motor (not shown), disposed inside the second arm 62, rotates the second arm 62 and the sprayer 32 along a direction, as shown by arrow D.

A water-supplying device 30 supplies DI water to the sprayer 32. Then, the DI water, spraying from the sprayer 32, cleans the surface of the wafer 20. In the bath 10, the wafer 20, rotating at high speed, is sprayed by the DI water and scrubbed by the scrubber 16 simultaneously.

A conventional scrubbing assembly for a wafer-cleaning device is shown in FIG. 2a and FIG. 2b. The scrubber 16 connects with the first arm 61 via a third arm 65. The first step motor 41, for controlling the self-rotation of the scrubber 16, is disposed inside the third arm 65. The first arm 61 is disposed on a platform 64. A cup 50, the second step motor 42 and the cylinder 43 are disposed on the platform 64. The second step motor 42 controls the rotation of the third arm 65. The cylinder 43 controls the upward and downward movement of the third arm 65. The cup 50 receives the scrubber 16 when the scrubber 16 does not scrub the wafer 20, that is, the scrubber 16 locates in an idle position.

Referring to FIG. 2b, the scrubber 16 is provided with a body 161, a rotary shaft 162 and scrubbing bristles 163. A space 164 is formed between the body 161 and the rotary shaft 162. A tube 63, for discharging water into the space 164, is disposed at the third arm 65.

After the conventional scrubber 16 scrubs a wafer, it moves to the position beyond the cup 50 from the bath 10 by the second step motor 42. Then, the scrubber 16 moves downwardly into the cup 50 by the cylinder 43. During the downward movement of the scrubber 16, the first step motor 41 rotates the scrubber 16 itself while the tube 63 supplies water into the space 164. As a result, the scrubbing bristles 163 are cleaned by the water while it rotates.

However, since the scrubbing bristles of the scrubbing assembly are simply cleaned by the water, particles adhering to the scrubbing bristles are not easy to remove. Furthermore, since the cleaning of the scrubbing bristles is not thorough, the problem of counter-contamination between wafers may occur. In addition, concurrent procedures may be affected by the particles.

SUMMARY OF THE INVENTION

In order to address the disadvantages of the aforementioned scrubbing assembly, the invention provides a scrubbing assembly with an extended lifespan and enhanced scrubbing ability.

Accordingly, the invention provides a scrubbing assembly for a wafer-cleaning device. The wafer-cleaning device is provided with a base. The scrubbing assembly comprises a scrubber, a cup and an oscillator. The scrubber is disposed on the base in a manner such that it can move between a first position and a second position. The scrubber scrubs a wafer when it locates in the first position. The cup, for receiving DI water, is disposed on the base. The scrubber locates inside the cup and is in contact with the DI water when it locates in the second position. The oscillator is disposed at the cup, and it vibrates the DI water when the scrubber locates inside the cup and is in contact with the DI water.

Furthermore, the cup is provided with a plurality of spraying holes that spray the DI water to the scrubber when the scrubber locates inside the cup and separates from the DI water.

Furthermore, the scrubbing assembly comprises a discharging device electrically connected with the cup, and the cup is provided with a discharging hole so that the discharging device actuates the discharging holes open to discharge the DI water after the scrubber scrubs a predetermined number of the wafers.

Furthermore, the scrubbing assembly comprises a first water-supplying device and a second water-supplying device. The first water-supplying device communicates with the spraying holes so that it sprays the DI water to the scrubber through the spraying holes when the scrubber locates inside the cup and separates from the DI water. The second water-supplying device is electrically connected with the discharging device so that it can supply the DI water after the discharging device discharges the DI water from the cup.

BRIEF DESCRIPTION OF THE DRAWINGS

The invention is hereinafter described in detail with reference to the accompanying drawings in which:

FIG. 2b is an enlarged view depicting a scrubber as shown in FIG. 2a;

DETAILED DESCRIPTION OF THE INVENTION

Figure 1:
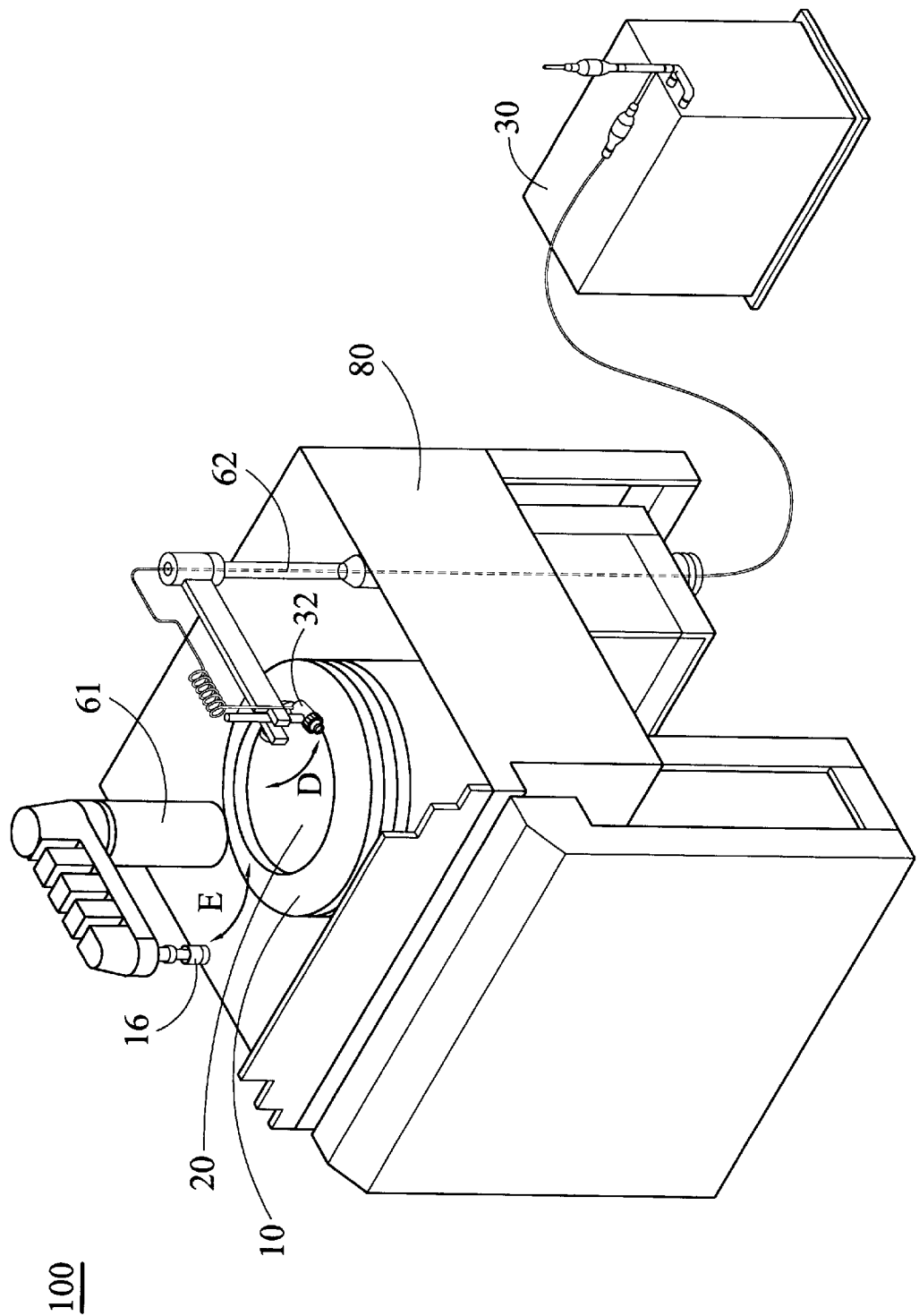
FIG. 1 is a schematic view depicting a conventional wafer-cleaning device.

A scrubbing assembly of this invention is adapted for a wafer-cleaning device as shown in FIG. 1. The scrubbing assembly comprises a scrubber 180, a cup 110 and an oscillator 120. The structure and the disposing manner of the scrubber 180 are the same as the conventional scrubber. The scrubber 180 is disposed on the base 80 in a manner such that it can move between a first position and a second position. The position of the scrubber 180 locating beyond the wafer 20, as shown in FIG. 1, refers here to the first position. The scrubber 180 scrubs a wafer 20 when it locates in the first position. The position of the scrubber 180 locating inside the cup 110 and in contact with the DI water refers here to the second position. Since the structure and the disposing manner of the scrubber 180 are the same as the conventional scrubber, its specific description is omitted.

Figure 2B:
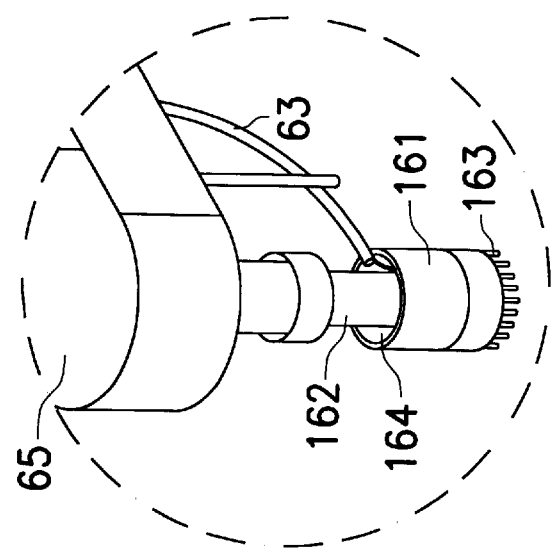
Figure 2A:
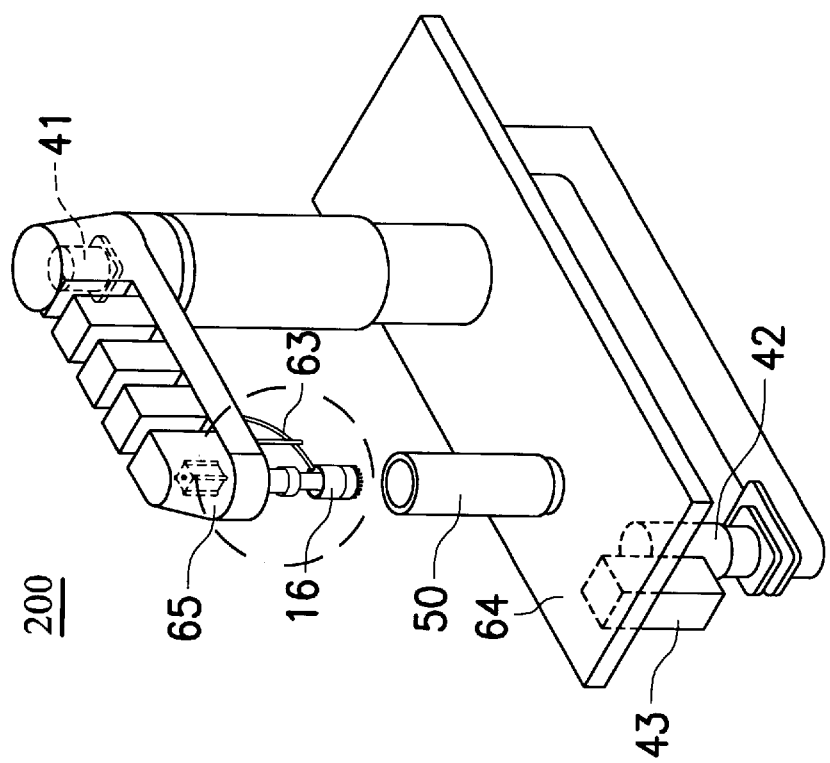
FIG. 2a is a schematic view depicting a conventional scrubbing assembly for the wafer-cleaning device.
Figure 3B:
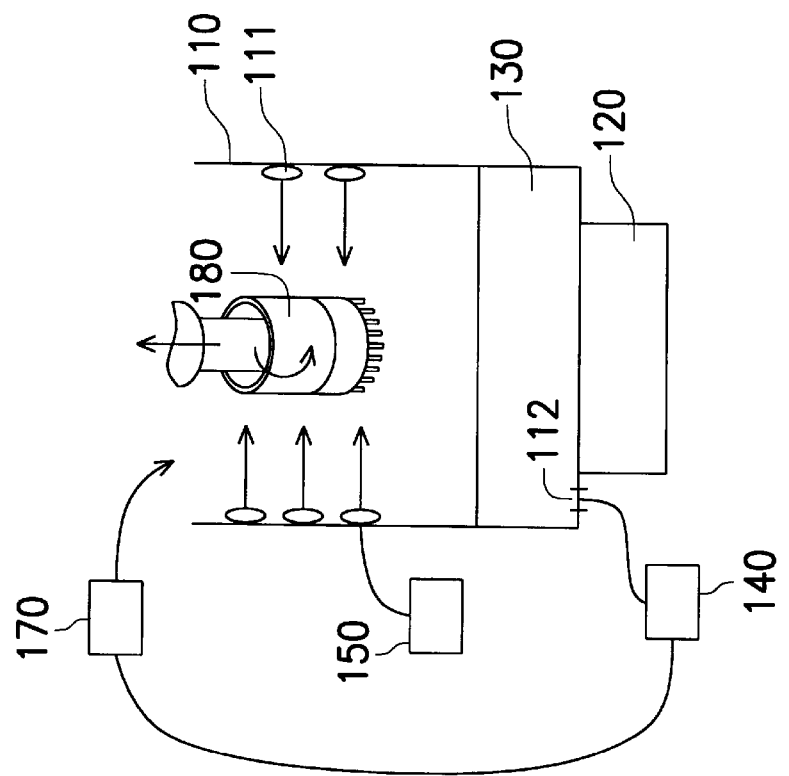
FIG. 3b is a schematic view depicting a cup of a scrubbing assembly for a wafer-cleaning device as disclosed in the invention, wherein the scrubber separates from the DI water.
Figure 3A:
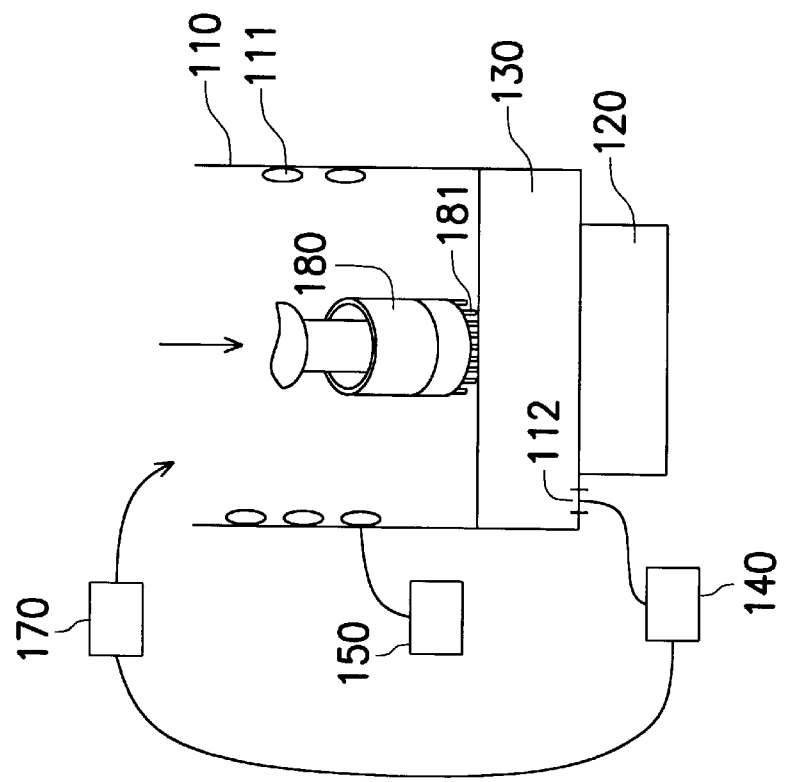
FIG. 3a is a schematic view depicting a cup of a scrubbing assembly for a wafer-cleaning device as disclosed in the invention, wherein the scrubber locates inside DI water.

Referring to FIG. 3a and FIG. 3b, the cup 110, for receiving DI water 130, is disposed on the platform 64 of the base 80, as shown in FIG. 2a. The oscillator 120 is disposed at the cup 110, and it vibrates the DI water 130 when the scrubber 180 locates inside the cup 110 and is in contact with the DI water 130.

Furthermore, the cup 110 is provided with a plurality of spraying holes 111 and a discharging hole 112. The scrubbing assembly further comprises a first water-supplying device 150. When the scrubber 180 locates inside the cup 110 and separates from the DI wafer 130, the first water-supplying device 150 sprays the DI water to the scrubber 180 through the spraying holes 111.

The scrubbing assembly further comprises a discharging device 140 and a second water-supplying device 170. The discharging device 140 is electrically connected with the cup 110 so that the discharging device 140 actuates the discharging holes 112 open to discharge the used DI water after the scrubber 180 scrubs a predetermined number of the wafers and is cleaned at corresponding number. The second water-supplying device 170 is electrically connected with the discharging device 140 so that it can supply the DI water after the discharging device 140 discharges the used DI water from the cup 110.

The structure of the scrubbing assembly of this invention is described as above, and its maintenance procedure is described as follows.

After the scrubber 180 scrubs a wafer, it moves to the position beyond the cup 110 from the first position by the second step motor 42. Then, the scrubber 180 moves to the second position; that is, the scrubber 180 moves downwardly into the cup 110 by the cylinder 43 and is in contact with DI water 130 as shown in FIG. 3a. Subsequently, the oscillator 120 is actuated to vibrate the DI water 130 so that scrubbing bristles 181 of the scrubber 180 is cleaned by the vibration of the DI water 130. Thus, particles such as dust, adhering to the scrubbing bristles 181 are removed.

When the scrubber 180 moves to the first position from the second position to scrub the next wafer, it rises as shown in FIG. 3b. At the same time, the first water-supplying device 150 sprays the DI water to the scrubber 180 through the spraying holes 111 to remove the remained particle. It is noted that the oscillator 120 is turned off at this time.

In addition, it is noted that the scrubber may be used in conditions that its structure remains the same with the conventional scrubber. Therefore, the scrubber itself may rotate when located in the cup. Also, the conventional tube may supply the water to the scrubbing bristles during the maintenance procedure of this invention. However, the rotation of the scrubber and the water-supplying of the tube are not limited as long as the cleaning result of the scrubber can attain a certain quality.

By means of the oscillator, the scrubber of this invention can remove particles with strong adherence. Thus, the scrubber can last longer, with cleaner scrubbing bristles.

While the invention has been particularly shown and described with reference to a preferred embodiment, it will be readily appreciated by those of ordinary skill in the art that various changes and modifications may be made without departing from the spirit and scope of the invention. It is intended that the claims be interpreted to cover the disclosed embodiment, those alternatives which have been discussed above, and all equivalents thereto.

What is claimed is:

1. A scrubbing assembly for a wafer-cleaning device, having a base, comprising:

a scrubber disposed on the base in a manner such that the scrubber moves between a first position and a second position, wherein the scrubber scrubs a wafer when the scrubber is located in the first position;

a cup, for receiving DI water, disposed on the base and provided with a plurality of spraying holes, wherein the scrubber is located inside the cup and in contact with the DI water therein when the scrubber is located in the second position; and an oscillator disposed at the cup, wherein the oscillator vibrates the DI water when the scrubber is located inside the cup and in contact with the DI water; and a discharging device, electrically connected to the cup, for discharging the DI water in the cup after the scrubber scrubs a predetermined number of the wafer;

a first water-supplying device electrically connected to the discharging device so that the first water-supplying device supplies the DI water after the discharging device discharges the DI water from the cup; and wherein the discharging device and the first water-supplying device cooperate to establish a level of DI water within the cup and the plurality of spraying holes are located above the water level so that the plurality of spraying holes may be used to clean the scrubber when the scrubber is inside the cup but spaced above the water level.

2. The scrubbing assembly as claimed in claim 1, wherein the cup is provided with a discharging hole, and the discharging device actuates the discharging hole to open to discharge the DI water.

3. The scrubbing assembly as claimed in claim 1, further comprising:

a second water-supplying device communicating with the spraying holes.

4. A wafer-cleaning device comprising:

a base for supporting a wafer;

a scrubber disposed on the base in a manner such that the scrubber moves between a first position and a second position, wherein the scrubber scrubs a wafer when the scrubber is located in the first position;

a cup, for receiving DI water, disposed on the base and provided with a plurality of spraying holes, wherein the scrubber is located inside the cup and in contact with the DI water therein when the scrubber is located in the second position; and an oscillator disposed at the cup, wherein the oscillator vibrates the DI water when the scrubber is located inside the cup and in contact with the DI water; and a discharging device, electrically connected to the cup, for discharging the DI water in the cup after the scrubber scrubs a predetermined number of the wafer;

a first water-supplying device electrically connected to the discharging device so that the first water-supplying device supplies the DI water after the discharging device discharges the DI water from the cup; and wherein the discharging device and the first water-supplying device cooperate to establish a level of DI water within the cup and the plurality of spraying holes are located above the water level so that the plurality of spraying holes may be used to clean the scrubber when the scrubber is inside the cup but spaced above the water level.

5. The device as claimed in claim 4, wherein the cup is provided with a discharging hole, and the discharging device actuates the discharging hole to open to discharge the DI water.

6. The device as claimed in claim 4, further comprising:

a second water-supplying device communicating with the spraying holes.

7. A scrubbing assembly for a wafer-cleaning device having a base, comprising:

a scrubber disposed on the base in a manner such that it moves between a first position and a second position, wherein the scrubber scrubs the wafer when it is in the first position;

a cup, for receiving DI water, disposed on the base, wherein the scrubber is located inside the cup and in contact with the water therein when it is in the second position, the cup is provided with a plurality of spraying holes operably connected to a first water-supplying device;

an oscillator disposed at the cup, wherein the oscillator vibrates the DI water when the scrubber is located inside the cup and in contact with the DI water;

a discharging device electrically connected with the cup and a discharging hole provided at a bottom portion of the cup so that the discharging device actuates the discharging hole to open to discharge the water after the scrubber scrubs a predetermined number of the wafer;

a second water-supplying device electrically connected to the discharging device so that it supplies the DI water after the discharging device discharges the DI water from the cup; and wherein the discharging device and the second water-supplying device cooperate to establish a level of DI water within the cup and the plurality of spraying holes are located above the water level so that they may be used to clean the scrubber when it is inside the cup but spaced above the water level.

* * * * *